United States Patent [19]
Smith et al.

[11] Patent Number: 5,451,946
[45] Date of Patent: Sep. 19, 1995

[54] APPARATUS AND METHOD FOR PRODUCING AN ANALOG OUTPUT SIGNAL FROM A DIGITAL INPUT WORD

[75] Inventors: Paul F. Smith, Fort Worth; Danny T. Pinckley, Arlington, both of Tex.

[73] Assignee: Motorola Inc., Schaumburg, Ill.

[21] Appl. No.: 83,813

[22] Filed: Jun. 28, 1993

[51] Int. Cl.⁶ ............................................. H03M 1/06
[52] U.S. Cl. ..................................... 341/118; 341/145
[58] Field of Search ....................... 341/118, 145, 144

[56] References Cited

U.S. PATENT DOCUMENTS

| | | | |
|---|---|---|---|
| 4,450,433 | 5/1984 | Moriyama | 341/145 |
| 4,503,421 | 3/1985 | Hareyama et al. | 341/145 |
| 4,523,182 | 6/1985 | Harvey et al. | 341/145 |
| 4,885,581 | 12/1989 | Sugawara et al. | 341/145 |
| 4,963,870 | 10/1990 | Obinata | 341/118 |
| 4,967,197 | 10/1990 | Peng | 341/118 |
| 5,153,592 | 10/1992 | Fairchild et al. | 341/118 |
| 5,198,814 | 3/1993 | Ogawara et al. | 341/118 |

*Primary Examiner*—Marc S. Hoff
*Attorney, Agent, or Firm*—Richard A. Sonnentag; Daniel C. Crilly

[57] ABSTRACT

A digital-to-analog converter (DAC, 300) utilizes a coarse DAC (306) and fine DAC (315) to produce an analog output signal having both low glitch energy and good linearity performance. The DAC (300) also uses an error table (312) to store correction data generated through a calibration procedure. Outputs (307, 311) from each DAC (306, 315) are summed to produce an analog output signal which exhibits better linearity than does the output (307) of the coarse DAC (306) alone.

16 Claims, 2 Drawing Sheets

APPARATUS AND METHOD FOR PRODUCING AN ANALOG OUTPUT SIGNAL FROM A DIGITAL INPUT WORD

FIELD OF THE INVENTION

The invention relates generally to communication devices and more particularly to the implementation of digital-to-analog converters (DACs) in communication devices.

BACKGROUND OF THE INVENTION

Digital-to-analog converters (DACs) are frequently used in the design of communication devices. By their design, however, DACs have inherent problems such as excess glitch energy upon a change in input voltage, settling problems immediately after the change in input voltage, and linearity problems related to the accuracy of an output voltage for a given input word. Each of these problems has its own effects on the performance of the communication device, specifically the spurious responses and intermodulation (IM) of signals resulting from the communication devices.

DACs are typically characterized by the number of bits that can be accepted at their input. Obviously, lower bit DACs (for example, 3–8 bit DACs) offer poor resolution, which consequently causes more distortion in the communication device. On the other hand, lower bit DACs are generally very fast and may exhibit fewer problems with respect to excess glitch energy and settling time. Higher bit DACs (10 to 16 bit DACs) offer better resolution (i.e., linearity performance) but are usually slow and may seriously suffer from the excess glitch energy/settling time problem. Consequently, when communication devices which are highly susceptible to the above-mentioned problems are designed, a severe compromise in the choice of DAC, and thus communication device performance, must be made.

Therefore, a need exists for a DAC which exhibits good excess glitch energy and settling performance while also exhibiting good linearity.

DETAILED DESCRIPTION OF A PREFERRED EMBODIMENT

A digital-to-analog converter (DAC) utilizes a first DAC as a coarse DAC and a second DAC as a fine DAC to produce an analog output signal having low excess glitch energy and good linearity performance in accordance with the invention. Use of this DAC improves spurious responses and IM performance in the design of communication devices.

Figure 1:
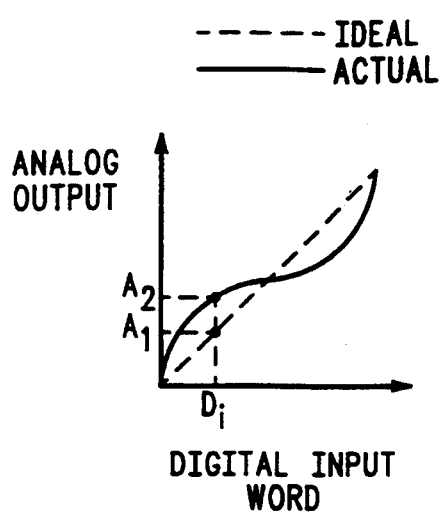
FIG. 1 generally depicts curves of an analog output of both ideal and actual DACs versus digital input words.

FIG. 1 depicts an ideal and actual curve for a digital input word versus an analog output for traditional DACs. As can be seen, the dashed line is straight and represents the ideal DAC while the solid line deviates from the ideal and represents actual performance of DACs. For a given digital input word, for example $D_i$, an ideal DAC would provide an analog output at $A_1$, while actual DACs may output an analog output at $A_2$. Consequently, actual DACs present a linearity problem approximately equal to the difference between analog outputs $A_2$ and $A_1$.

Figure 2:
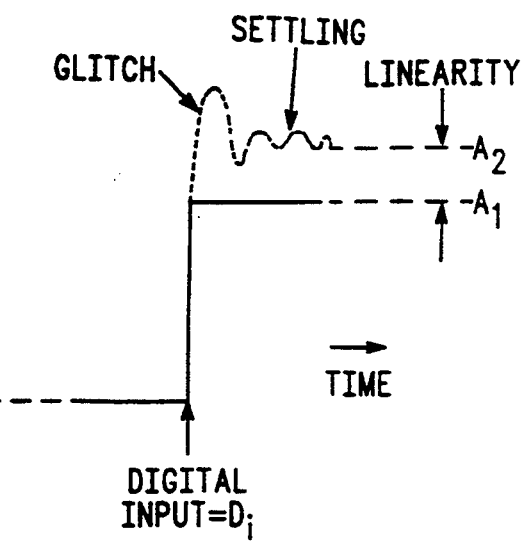
FIG. 2 generally depicts excess glitch energy, settling and linearity problems of actual DACs at the time shortly after input of a digital word $D_i$.

This problem is expanded in reference to FIG. 2. As can be seen, at a time digital input $D_i$ is input into an actual DAC, the state of the analog output changes. FIG. 2 discloses the excess glitch energy, settling and linearity problems previously described. As previously stated, the typical compromise when using actual DACs occurs between the excess glitch energy and linearity when designing communication devices.

Figure 3:
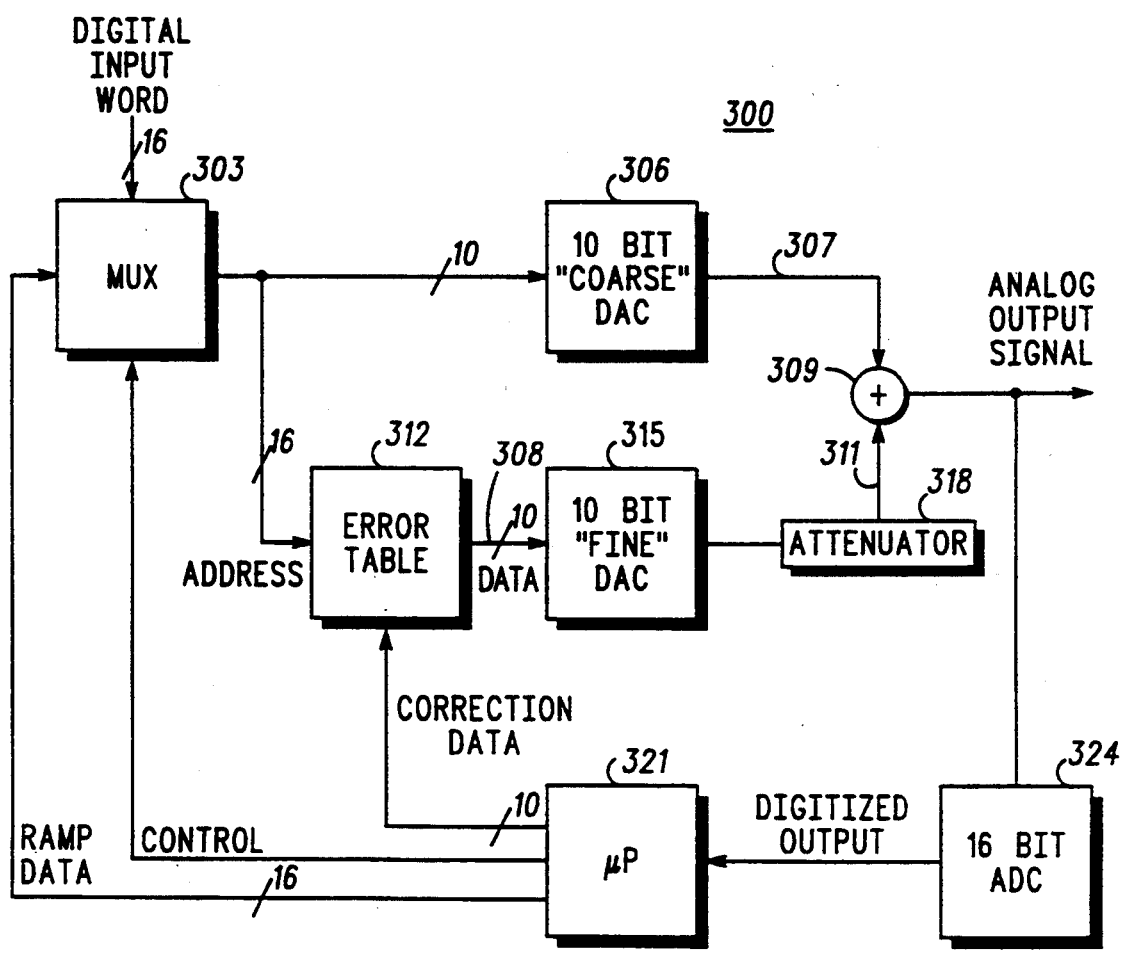
FIG. 3 generally depicts in block diagram form use of a coarse DAC, a fine DAC, and an error table in accordance with the invention.

FIG. 3 generally depicts in block diagram form use of a coarse DAC 306, a fine DAC 315, and an error table 312 in accordance with the invention. DAC 300 uses calibrated data in an error table 312 to provide an increased resolution to an analog output signal. Consequently, low bit DACs which provide good excess glitch energy performance can be utilized in DAC 300 since the analog output has its resolution (or linearity) increased.

In the preferred embodiment, DAC 300 is periodically calibrated to maintain adequate operation. In the preferred embodiment, the calibration is based on a digitized DC source being input to a first DAC 306 and a second DAC 315, but alternate embodiments may implement, inter alia, sine sources or noise sources as the calibrating source utilized by $\mu P$ 321. Continuing, to calibrate DAC 300, $\mu P$ 321 applies a digitized stepped ramp (i.e., an incrementing digital input word represented by a binary number) to the input of a first DAC, which in the preferred embodiment is a 10-bit coarse DAC 306 and a second DAC, which in the preferred embodiment is a 10-bit fine DAC 315. $\mu P$ 321 also monitors the output of a high resolution, highly linear analog-to-digital converter (ADC) 324. In the preferred embodiment, ADC 324 is a 16-bit ADC, but may be a N-bit ADC where N is greater than the bit number of coarse DAC 315 (i.e., 10 in the preferred embodiment). The output of ADC 324 represents the digitized output of a summation, by summing circuit 309, of the output of coarse DAC 306 and fine DAC 315. As the ramp is increased, the linearity of coarse DAC 306 and fine DAC 315 can be determined and corrected by inputting a value into error table 312, which eventually outputs data which is input into fine DAC 315. Location within error table 312 of the correction data is by an address which is the binary representation of the corresponding digital input word. During this calibration procedure, $\mu P$ 321 enables multiplexer 303, via a control signal, to accept the ramp data input.

In the preferred embodiment, error table 312 is a 64K×10-bit random access memory (RAM), but any size RAM may be utilized. A typical method of setting linear increments during calibration is to fill error table 312 with some middle value (e.g., 512 for a 10-bit RAM). The input into DAC 306 can then be forced to all 1's giving a full scale output, followed by all 0's, giving a minimum output. With these extremes, a linear ramp will produce expected values with $2^N$ increments (N being the word size of the coarse DAC, which in the preferred embodiment is a 10-bit word size). As the ramp is applied to coarse DAC 306, the input 308 of fine DAC 315 is adjusted by storing values into the error table 312. Thus, the total output can be forced to be equal to the calculated linear increments, within constraints presented by the linearity of high resolution ADC 324. When all the potential digital input words have been characterized in this manner, $\mu$P 321 enables multiplexer 303, via a control signal, to allow input of digital input words from circuitry external to DAC 300. As the digital input goes through its various words, fine DAC 315 provides correction to the linear scale as determined by the contents of error table 312.

When a digital input word is input into DAC 300, coarse DAC 306 accepts as input a portion of the digital input word and outputs a first analog signal. At this point, error table 312 has stored a predetermined stored value (correction data) related to the digital input word and first analog signal 307 which may be retrieved based on an address input into error table 312. Fine DAC 315 has as input an error word 308 which is related to the predetermined stored value within error table 312. At this time, fine DAC 315 outputs a second analog signal 311 which is then summed, via summing circuit 309, with first analog signal 307 to produce an analog output signal. In the preferred embodiment, second analog signal 311 is attenuated by attenuator 318 so that coarse DAC 306 and fine DAC 315 may be purchased as a common part, but utilized for different operations within DAC 300. Also in the preferred embodiment, the predetermined stored value is related to a difference between the digital input word and a digital representation (digitized output from ADC 324) of first analog signal 307. At this point, after summation by summing circuit 309, the analog output signal produced is a more accurate representation of the digital input word than is first analog signal 307 alone.

Figure 4:
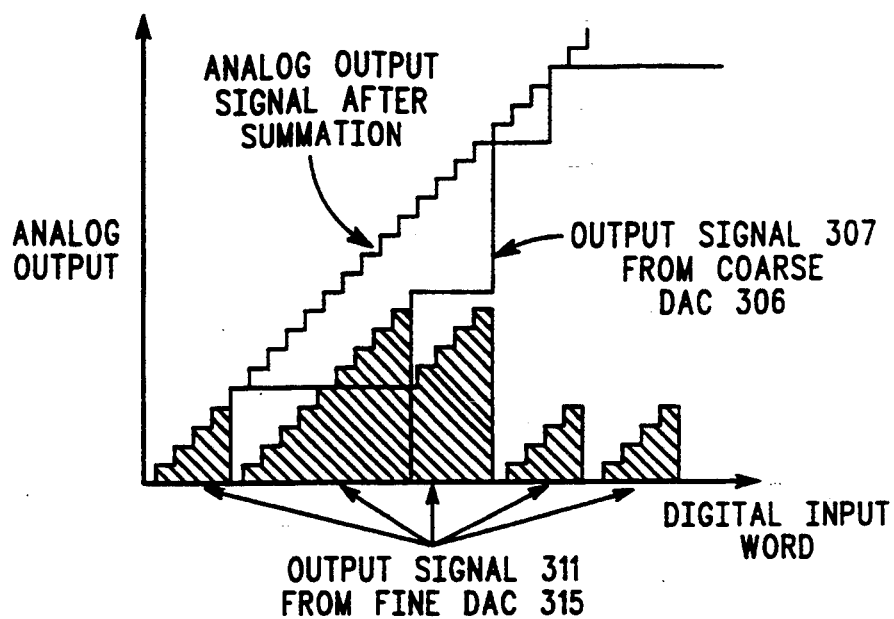
FIG. 4 generally depicts individual output signals from both coarse DAC and fine DAC and a summation of those signals in accordance with the invention.

This accurate representation can be more vividly demonstrated with reference to FIG. 4, which depicts the resulting summation of signals 307 and 311 in accordance with the invention. FIG. 4 shows output signal 307 from coarse DAC 306, which for some digital input words, yields an analog output which is far from the curve depicted in FIG. 1 for an ideal DAC. FIG. 4 also shows output signal 311 from fine DAC 315 for corresponding digital input words. When the two signals 307, 311 are summed, their resulting summation is shown in FIG. 4 as being very near the curve for an ideal DAC as depicted in FIG. 1. As can be clearly seen, the analog output signal after summation is a more accurate representation (i.e., more linear thus more accurate) of the digital input word than is first analog signal 307 alone.

Figure 5:
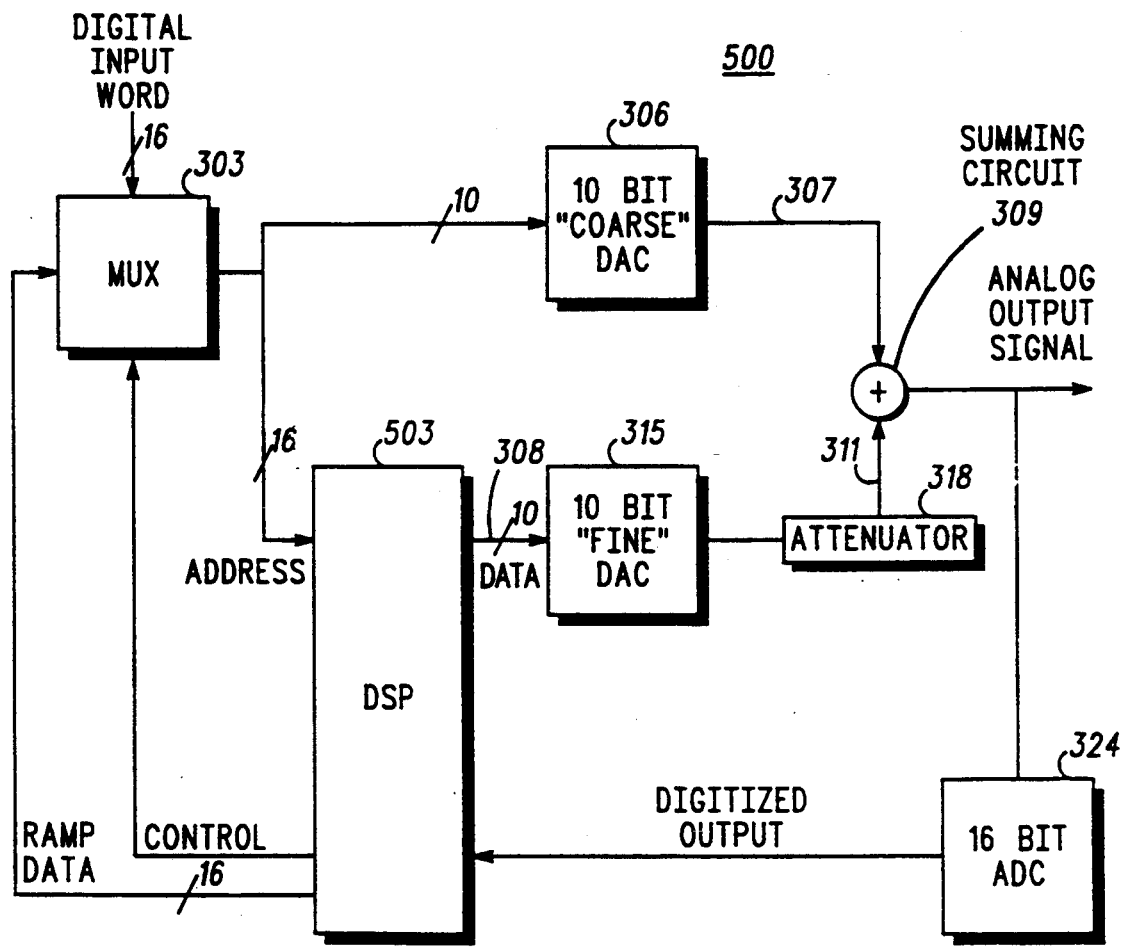
FIG. 5 generally depicts an alternate embodiment, in block diagram form, of a DSP-controlled DAC as shown in FIG. 3 in accordance with the invention.

FIG. 5 depicts an alternate embodiment of a DAC 500 in accordance with the invention. In this embodiment, error table 312 and $\mu$P 321 are replaced by a digital signal processor (DSP) 503. DSP 503 either stores or calculates an error word and provides the error word when addressed at an address represented by the digital input word. A typical DSP 503 that may be used is a Motorola 56000. In this configuration, calibration and operation of DAC 500 is the same as described above.

While the invention has been particularly shown and described with reference to a particular embodiment and an alternate embodiment, it will be understood by those skilled in the art that various changes in form and details may be made therein without departing from the spirit and scope of the invention.

What we claim is:

1. An apparatus for producing an analog output signal from a digital input word, the apparatus comprising:
   a first digital-to-analog converter having as input a portion of the digital input word and outputting a first analog signal;
   an error table having a predetermined stored value related to the digital input word and the analog output signal;
   a second digital-to-analog converter, coupled to the error table, having as input an error word related to the predetermined stored value and outputting a second analog signal;
   a summing circuit, coupled to the first digital-to-analog converter and the second digital-to-analog converter, for summing the first analog signal and the second analog signal to produce the analog output signal;
   means, coupled to the summing circuit, for producing a digital representation of the analog output signal; and
   means, coupled to the means for producing and the error table, for periodically updating the predetermined stored value based on the digital representation of the analog output signal.

2. The apparatus of claim 1 wherein said means for periodically updating updates the predetermined stored value based on a difference between the digital input word and the digital representation of the analog output signal.

3. The apparatus of claim 1 wherein the analog output signal produced is a more accurate representation of the digital input word than is the first analog signal.

4. An apparatus for producing an analog output signal from a digital input word, the apparatus comprising:
   a first digital-to-analog converter having as input a portion of the digital input word and outputting a first analog signal;
   a second digital-to-analog converter having as input an error word and outputting a second analog signal;
   a summing circuit, coupled to the first digital-to-analog converter and the second digital-to-analog converter, for summing the first analog signal and the second analog signal to produce the analog output signal;
   an analog-to-digital converter, coupled to the summing circuit for converting the analog output signal to a digital monitor word; and
   a controller, coupled to the analog-to-digital converter and the second digital-to-analog converter, for periodically producing the error word, wherein the error word is related to the digital input word and the digital monitor word.

5. The apparatus of claim 4 wherein the analog-to-digital converter comprises a 16-bit analog-to-digital converter.

6. The apparatus of claim 4 wherein the controller comprises:
   a microprocessor, coupled to the analog-to-digital converter, for generating the error word; and
   an error table, coupled to the microprocessor and the second digital-to-analog converter, for storing the error word and providing the error word to the second digital-to-analog converter when addressed at an address represented by the digital input word.

7. The apparatus of claim 4 wherein the controller comprises a digital signal processor (DSP) for storing and calculating the error word and providing the error word to the second digital-to-analog converter when addressed at an address represented by the digital input word.

8. The apparatus of claim 4 wherein the analog output signal produced is a more accurate representation of the digital input word than is the first analog signal.

9. A method of producing an analog output signal from a digital input word, the method comprising the steps of:
   converting a portion of the digital input word to a first analog signal;
   retrieving a predetermined stored value related to the digital input word and the analog output signal;
   converting an error word related to the predetermined stored value to a second analog signal;
   summing the first analog signal and the second analog signal to produce the analog output signal; and
   periodically updating the predetermined stored value based on the analog output signal.

10. The method of claim 9 wherein said predetermined stored value related to the digital input word and the analog output signal further comprises a predetermined stored value related to a difference between the digital input word and a digital representation of the analog output signal.

11. The method of claim 9 wherein the analog output signal produced is a more accurate representation of the digital input word than is the first analog signal.

12. A method of producing an analog output signal from a digital input word, the method comprising the steps of:
    converting a portion of the digital input word to a first analog signal;
    converting the analog output signal to a digital monitor word;
    providing an error word related to the digital input word and the digital monitor word;
    converting the error word to a second analog signal;
    summing the first analog signal and the second analog signal to produce the analog output signal; and
    periodically updating the error word based on the analog output signal.

13. The method of claim 12 wherein the step of converting the analog output signal to a digital monitor word further comprises the step of converting the analog output signal to a 16-bit digital monitor word.

14. The method of claim 12 wherein the step of providing an error word further comprises the steps of:
    generating the error word; and
    calculating or storing the error word and providing the error word when addressed at an address represented by the digital input word.

15. The method of claim 12 wherein the step of providing an error word further comprises the step of storing or calculating the error word and providing the error word when addressed at an address represented by the digital input word.

16. The method of claim 12 wherein the analog output signal produced is a more accurate representation of the digital input word than is the first analog signal.

* * * * *